Oct. 26, 1965

C. A. VON URFF, JR 3,214,603

TRANSISTOR EXPONENTIAL CIRCUIT

Filed Dec. 9, 1959

INVENTOR.
CHARLES A. VON URFF, JR.
BY Joseph D. Black
ATTORNEY

United States Patent Office 3,214,603

Patented Oct. 26, 1965

3,214,603
TRANSISTOR EXPONENTIAL CIRCUIT

Charles A. Von Urff, Jr., Nixon, N.J., assignor to Radio Corporation of America, a corporation of Delaware Filed Dec. 9, 1959, Ser. No. 858,361
6 Claims. (Cl. 307—88.5)

The invention relates to circuits which are capable of performing, in real time, the mathematical operation of taking the exponential of an input function of time. Particularly, the invention relates to a transistor exponential circuit.

There are many examples in the fields of analog computers, communication, radar and telemetering where it is desirable to be able to take the exponential of an incoming waveform. An exponential circuit can be used in a circuit for deriving a square root or any root or power desired. Further, an exponential circuit may be used where it is desired to expand in a non-uniform manner the amplitude of a waveform, and thereby improve the signal to noise characteristic of an incoming waveform, for example. The later use is referred to as non-linear or exponential expansion.

Exponential circuits have previously involved the placing of a logarithmic circuit in a feedback loop, thus obtaining an exponential variation of output vs. input. Some of the difficulties encountered in the use of such a feedback arrangement are poor frequency response, poor direct current stability, the need for setting and matching of direct current levels, the general complexity of the arrangement, and the need for two polarities of supply voltage.

It is an object of the invention to provide an improved exponential circuit.

Another object is to provide a novel, simplified circuit capable of taking the exponential of an incoming waveform, and which exhibits good frequency response, good direct current stability and good dynamic range.

A further object is to provide a novel, entirely direct current coupled transistor exponential circuit having both input and output taken with respect to ground.

A still further object is to provide a novel transistor exponential circuit which avoids the difficulties encountered in using circuits previously available.

The objects of the invention are accomplished by providing a circuit including three transistor stages connected in cascade. The three stages act as an inverter, constant voltage type signal source and exponential stage, in that order. In more detail, an incoming waveform or signal, which, with respect to ground or point of reference potential is at a direct current level other than zero and does not pass through zero, is applied to the first transistor stage. The inverted signal is applied from the first stage to the second transistor stage which is connected as an emitter-follower to provide a constant voltage type source. The output voltage of the second stage is applied as forward bias to the base-emitter junction of the third transistor stage. An output is taken between the collector electrode of the third stage and ground or point of reference potential.

The operation of the invention depends upon the fact that when a semiconductor junction is driven from a constant voltage type source so as to be forward biased in its exponential operating region, the output current varies exponentially with the applied voltage. By the use of the base-emitter junction of the third transistor stage as the forward biased junction, the output current taken from the collector electrode of the third transistor varies exponentially with the voltage applied to the junction. The third transistor stage is operated in the non-linear region of its transfer characteristic, as contrasted to the more usual transistor operation in the linear region. Both the input and output of the circuit are taken with respect to ground or the point of reference potential, facilitating the connection of the input to a source of the incoming waveform and the connection of a desired utilization circuit to the output. In addition to providing the exponential operation, the third stage also provides amplification of the exponential current. An exponential circuit which is simple in operation and in construction, and includes features of operation not previously available in such a circuit is provided.

A more detailed description of the invention will now be given in connection with the accompanying drawing, wherein.

Figures 1, 2, 3:
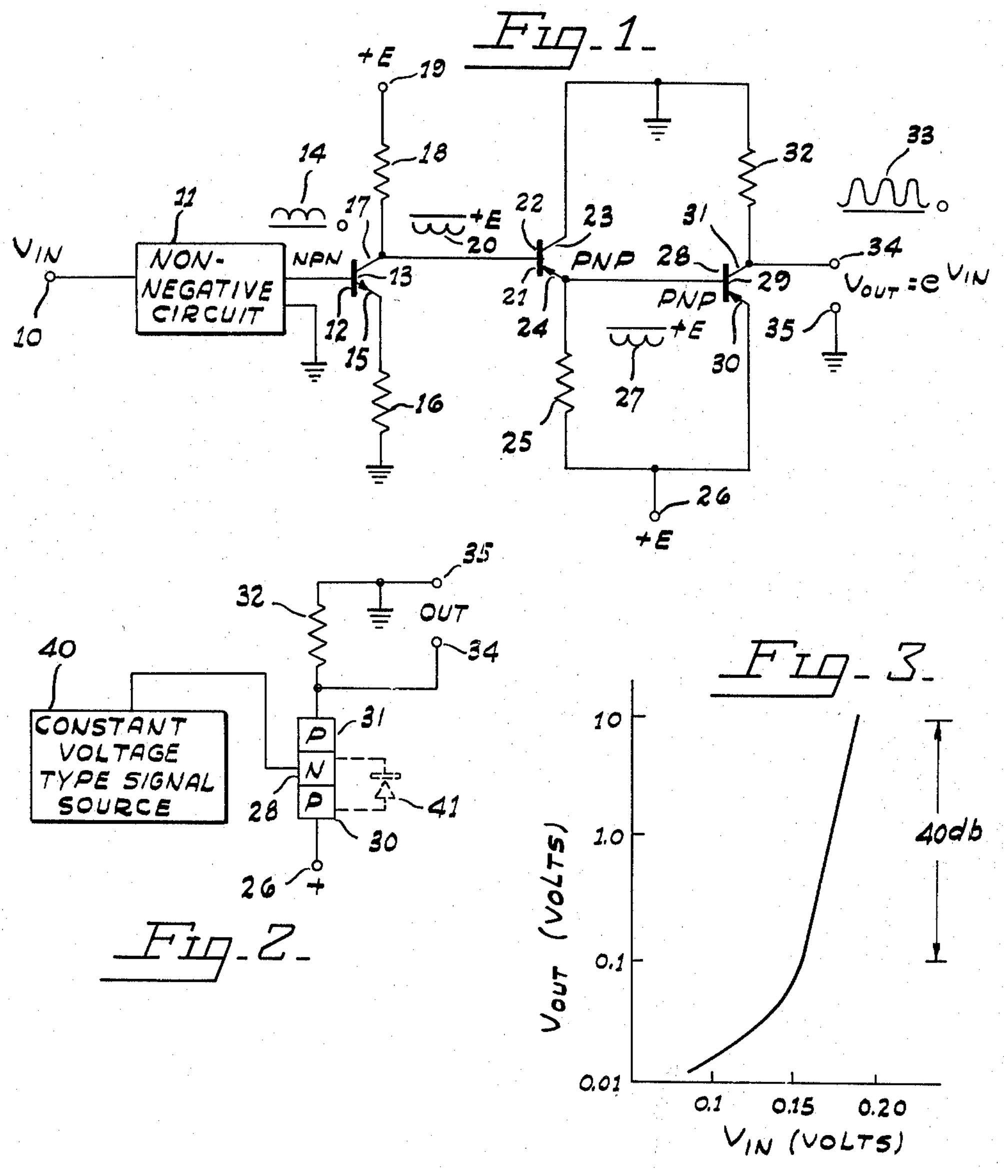
FIGURE 1 is a circuit diagram of an exponential circuit constructed according to one embodiment of the invention.
FIGURE 2 is a circuit diagram used to describe the operation of the embodiment shown in FIGURE 1.
FIGURE 3 is a curve useful in describing the operation of the embodiment shown in FIGURE 1.

In the embodiment shown in FIGURE 1, an input signal from which it is desired to derive the exponential is applied to an input terminal 10. The input signal may include voice, pulse or other modulating signal information. The signal must be made to have a direct current level such that the signal does not pass through zero. If the input signal has this characteristic, it can be fed directly to the input of the exponential circuit. Assuming that the input signal does not possess this characteristic, the input signal is first applied from the terminal 10 to a non-negative circuit 11.

The non-negative circuit 11 may include any arrangement capable of adjusting the direct current level of the input signal so that the signal does not pass through zero. A simple method of converting the signal into a non-negative signal is to add a constant voltage by a battery or other source of constant positive potential to the input signal equal in value to the largest negative peak.

The non-negative signal voltage appearing at the output of the circuit 11 is taken with respect to ground and is applied to the base electrode 12 of an NPN type junction transistor 13. A typical signal 14 at the base electrode 12 is shown in FIGURE 1. The term "ground," as used in the specification, is to be understood as referring to a point of reference potential and not necessarily earth ground.

The transistor 13 includes an emitter electrode 15 which is connected through a resistor 16 to ground. The collector electrode 17 of the transistor 13 is connected through a resistor 18 to the positive terminal 19 of a source of unidirectional potential. The emitter electrode 15 is biased in the forward direction with respect to the base electrode 12, while the collector electrode 17 is biased in the reverse direction with respect to the base electrode 12. Transistor 13 conducts in response to the signal 14. An output signal 20 which is the inverse of the signal 14 and is taken with respect to the potential at terminal 19 appears at the collector electrode 17, and is applied from the collector electrode 17 to the base electrode 21 of a PNP type junction transistor 22.

The transistor 22 includes a collector electrode 23 connected to ground, and an emitter electrode 24 connected through a small resistor 25 to the positive terminal 26 of a source of unidirectional potential. The potential supplied at terminal 26 is preferably of the same level as that supplied at terminal 19, requiring the use of only one unidirectional power supply. The emitter electrode 24 is biased in the forward direction with respect to the base electrode 21, while the collector electrode 23 is biased in the reverse direction with respect to the base electrode 21. Transistor 22 conducts in response to the signal 20. Transistor 22 is connected as an emitter-follower with a small emitter load resistor 25 in order to provide a low driving impedance for the third and last stage of the exponential circuit.

The output voltage 27 of the transistor 22 is taken with respect to the potential at the terminal 26 and is applied from the emitter electrode 24 to the base electrode 28 of a PNP type junction transistor 29. The transistor 29 includes an emitter electrode 30 connected directly to the terminal 26 and a collector electrode 31 connected through a resistor 32 to ground. The emitter electrode 30 is biased in the forward direction with respect to the base electrode 28, while the collector electrode 31 is biased in the reverse direction with respect to the base electrode 28. The transistor 29 is biased to conduct in the non-linear region of its transfer characteristic.

As will be described more fully, the current across the base-emitter junction of transistor 29 varies exponentially with the voltage applied to the junction from transistor 22. The collector electrode 31 represents a third electrode at which the current across the junction is reflected. A transistor 29 is chosen which has a substantially constant beta, where beta is the ratio between the collector current and the base current. Current gain, as well as the exponential operation, is obtained by using the base-emitter junction of a transistor 29 to perform the exponential operation. The output exponential signal 33 is taken across the resistor 32 with respect to ground, and appears at the output terminals 34, 35 for application to a desired utilization circuit.

The constant voltage type source which is the emitter-follower transistor 23 shown in FIGURE 1 is presented in FIGURE 2 as block 40. The elements which are common to FIGURES 1 and 2 are given the same reference numbers.

As shown in FIGURE 2, a P-N junction exists between the emitter electrode 30 and base electrode 28. The presence of the free holes in the P type region and the presence of the free electrons in the N type region creates a potential at the junction which is referred to as the potential gradient or potential energy barrier. In the presence of a forward bias applied to the junction, this barrier is lowered, permitting a current flow of holes and electrons in opposite directions over the barrier. These currents are zero when the applied voltage is zero, and increase exponentially to large values for increasing bias values. The electrical currents across the barrier add, so that the total current, including the effects of both holes and electrons, varies exponentially with the applied voltage. In effect, the base-emitter rectifying junction represents a diode 41, with current flow in the direction of the arrow. Because the current in the collector electrode 31 circuit is a function of the base electrode 28 current, the transistor 29 being operated in the non-linear region of its transfer characteristic, the desired output signal can be derived by taking the output voltage signal across the resistor 32 in the collector circuit. A more detailed discussion of the manner in which a P-N junction exhibits an exponential variation of current with applied voltage when forward biased from a constant voltage type source may be found in such references as, "Introduction to Solid State Physics," by Charles Kittel, second edition, page 389 on, published by John Wiley and Sons.

A feature of the invention is the fact that, by using the base-emitter junction of a transistor to perform the exponential operation, current gain is also obtained. As is understood, the gain results from the fact that $$I_c=\beta I_b$$

where $I_c$ is the collector current, $\beta$ is the ratio beta, and $I_b$ is the base current. Ideally, beta, or the ratio of collector current to base current, should be constant over the current swing of the transistor. This condition can be approached by commercial transistors presently available. Both the derivation of and the amplification of the exponential voltage is thus obtained by the invention.

A further feature of the invention is the fact that both the input and output are taken with respect to ground. In order to have the output voltage of transistor 28 with respect to ground, the input to transistor 29 must be with respect to the potential at terminal 26. Accordingly, the output of the transistor 22 is taken with respect to the potential at the terminal 26. The input to the transistor 22 must also be with respect to the potential at terminal 26. By using a transistor 13 of NPN type for the inverter, the output voltage of the transistor 13 is taken with respect to the potential at terminal 19 and the input to the transistor 22 is with respect to the proper potential. The input to the transistor 13 and the exponential circuit is with respect to ground. Thus, both the input and output are with respect to ground, facilitating the use of the circuit in a wide range of applications.

While the transistor 13 will provide some gain, the transistor 22, because of the small emitter load, will have a gain less than unity. The values of the resistor 16 and 18 can be adjusted, so that voltage gain of the proper amount results between the input of transistor 13 and the output of transistor 22. The mathematical operation desired can be achieved by setting in this manner the combined gain of the transistor 13 and 22.

The exponential circuit of the invention is entirely direct current coupled. These are no direct current setting problems and feedback loops as previously required in such circuits. Further, only one polarity of supply voltage is needed. Good direct current stability results from the use of both NPN and PNP type transistors.

By way of example only, the following types of transistors and values were used in an exponential circuit constructed according to the embodiment given in FIGURE 1.

| | |
|---|---|
| Transistor **13** | 2N647 (or 2N35). |
| Transistor **22** | 2N270. |
| Transistor **29** | 2N270. |
| Resistor **16** | 4,700 ohms. |
| Resistor **18** | 4,700 ohms. |
| Resistor **25** | 270 ohms. |
| Resistor **32** | 680 ohms. |
| Terminals **19**, **26** | 12 volts. |

A variable direct current was applied to the input of transistor 13, and a direct current signal was taken at the output of transistor 29. A curve for the voltage-in versus voltage-out as shown in FIGURE 3 resulted. The ordinate or volts-out is plotted on a logarithmic scale. The circuit exhibited an exponential characteristic over a dynamic range of 40 db. In practice, the frequency response of the exponential circuit is limited only by the beta cut-off of the transistor 29. Operation up into the megacycle range is therefore possible.

While particular transistor types are shown in FIGURE 1, the invention is not limited thereto. Transistors 22 and 29 may be NPN type transistors and transistor 13 a PNP type transistor by merely altering the supply voltage polarity and electrode connections in a manner understood in the art. The operation of the invention will otherwise than the changes in polarity remain as described. While the use of a non-negative circuit 11 has been assumed, a non-positive circuit may be used as well by properly arranging the transistors and transistor electrode connections.

Figure 4:
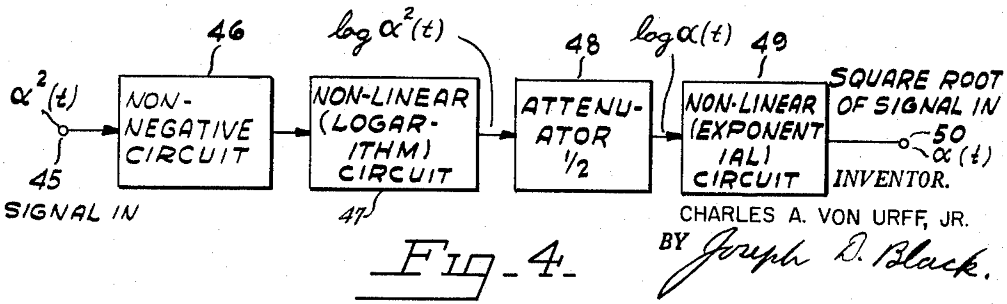
FIGURE 4 is a block diagram illustrating one arrangement in which the invention may be used.

The invention can be used by itself to perform the exponential operation in such uses as waveform expanders. It can be used in conjunction with a logarithmic circuit to either raise a function to a power or take its root, depending on whether gain or attenuation is placed between the logarithmic circuit and the exponential circuit. One application of the invention in a square rooter is given in FIGURE 4. A signal is applied to terminal 45. Since it is desired to derive the square root, the signal is shown as $\alpha^2(t)$, where $t$ is time. The signal is fed from the terminal 45 and through a non-negative circuit 46 to a non-linear, logarithm circuit 47. The signal which is now log $\alpha^2(t)$ is fed through a one-half atenuator 48. The signal becomes log $\alpha(t)$. The signal log $\alpha(t)$ is fed through a non-linear, exponential circuit 49 constructed according to the invention to produce at the output terminal 50 the square root of the input signal or $\alpha(t)$.

What is claimed is:

1. In combination, inverting means responsive to a signal which is always of negative polarity, an NPN junction transistor device having base, emitter and collector electrodes, means having a low output driving impedance coupled to said inverting means for forward biasing the junction formed by said base and emitter electrodes in its exponential operating region, said bias varying according to said signal, and means coupled to said collector electrode and responsive to the collector current for providing an amplified output signal voltage which is the exponential of said first signal.

2. In combination, inverting means responsive to a signal which is always of positive polaritly, a PNP junction transistor device having base, emitter and collector electrodes, means having a low output driving impedance coupled to said inverting means for forward biasing the junction formed by said base and emitter electrodes in its exponential operating region, said bias varying according to said signal, and means coupled to said collector electrode and responsive to the collector current for providing an amplified output signal voltage which is the exponential of said first signal.

3. An exponential circuit comprising, input means responsive to a signal which is always of one polarity, a first transistor device having an emiter electrode connected through a small resistor to a source of unidirectional potential, a collector electrode connected solely and directly to a point of reference potential, and a base electrode, means for applying said signal from said input means to said base electrode so as to cause said device to conduct, a second transistor device having a near constant beta and a collector electrode connected through a second resistor to said point of reference potential, an emitter electrode connected directly to said source of unidirectional potential, and a base electrode, means to apply the signal at said emitter electrode of said first device to said base electrode of said second device to forward bias the base-emitter junction of said second device in its exponential operating region from the low driving impedance presented by said first device, and an output terminal connected to the junction of said second resistor and the collector electrode of said second device.

4. An exponential circuit comprising, input means responsive to a signal which is always of one polarity, a first PNP type junction transistor device having an emitter electrode connected through a small resistor to a source of positive potential, a collector electrode connected solely and directly to a point of reference potential, and a base electrode, means for applying said signal from said input means to said base electrode so as to cause said device to conduct, a second PNP type junction transistor device having a collector electrode connected through a second resistor to said point of reference potential, an emitter electrode connected directly to said source of positive potential, and a base electrode, means to apply the signal at the emitter electrode of said first device to the base electrode of said second device to forward bias the base-emitter junction of said second device in its exponential operating region from the low driving impedance provided by said first device, and an output circuit connected between said point of reference potential and the junction of the collector electrode of said second device and said second resistor.

5. An exponential circuit comprising, a first junction transistor device of one type of conductivity and having a collector electrode connected through a resistor to a source of unidirectional potential of the proper polarity to cause said device to conduct, an emitter electrode coupled to a point of reference potential, and a base electrode, means to apply a signal to said base electrode which is always of one polarity and is taken with respect to said point of reference potential, said device being arranged to invert said signal and to produce said inverted signal at said collector electrode, a second junction transistor device of the opposite type of conductivity and having a collector electrode connected solely and directly to said point of reference potential, an emitter electrode connected through a small resistor to said source of unidirectional potential, and a base electrode, means to apply said inverted signal from the collector electrode of said first device to the base electrode of said second device, a third junction transistor device of said opposite type of conductivity and having a collector electrode connected through a resistor to said point of reference potential, an emitter electrode connected directly to said source of unidirectional potential, and a base electrode, means to apply the signal at the emitter electrode of said second device to the base electrode of said third device to forward bias the base-emitter junction of said third device in its exponential operating region from the low driving impedance presented by said second device, and an output circuit connected between the collector electrode of said third device and said point of reference potential.

6. An exponential circuit comprising, an NPN type transistor device having a collector electrode connected through a resistor to a source of positive potential, an emitter electrode coupled to a point of reference potential, and a base electrode, means to apply a signal to said base electrode which is always of positive polarity and is taken with respect to said point of reference potential, said device being arranged to invert said signal and to produce said inverted signal at said collector electrode, a second transistor device of PNP type and having a collector electrode connected solely and directly to said point of reference potential, an emitter electrode connected through a small resistor to said source of positive potential, and a base electrode, means to apply said inverted signal at the collector electrode of said first device to the base electrode of said second device, a third transistor device of PNP type and having a near constant beta and a collector electrode connected through a resistor to said point of reference potential, an emitter electrode connected directly to said source of positive potential, and a base electrode, means to apply the signal at the emitter electrode of said second device to the base electrode of said third device to forward bias the base-emitter junction of said third device in its exponential operating region from the low driving impedance presented by said second device, and an output circuit connected between the collector electrode of said third device and said point of reference potential.

References Cited by the Examiner

UNITED STATES PATENTS

| | | | |
|---|---|---|---|
| 2,858,379 | 10/58 | Stanley | 330—32 X |
| 2,949,543 | 8/60 | Nordahl et al. | 307—88.5 |
| 3,109,103 | 10/63 | Wilhelmsen | 328—145 X |

OTHER REFERENCES

"Theory and Experiment for a Germanium P-N Junction," F. S. Goucher et al., Physical Review, vol. 81, No. 4, pages 637–638, 1951.

JOHN W. HUCKERT, *Primary Examiner.*

LEO SMILOW, DARYL W. COOK, *Examiners.*